(12) United States Patent
Cummings et al.

(10) Patent No.: US 8,790,991 B2
(45) Date of Patent: Jul. 29, 2014

(54) METHOD AND STRUCTURE FOR SHALLOW TRENCH ISOLATION TO MITIGATE ACTIVE SHORTS

(75) Inventors: Jason E. Cummings, Smithfield, NC (US); Balasubramanian S. Haran, Watervliet, NY (US); Hemanth Jagannathan, Guilderland, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 13/011,546

(22) Filed: Jan. 21, 2011

(65) Prior Publication Data

US 2012/0187523 A1  Jul. 26, 2012

(51) Int. Cl.
| H01L 21/76 | (2006.01) |
| H01L 21/762 | (2006.01) |
| H01L 21/02 | (2006.01) |
| H01L 21/8234 | (2006.01) |
| H01L 29/06 | (2006.01) |

(52) U.S. Cl.
CPC ..... *H01L 21/76224* (2013.01); *H01L 21/02107* (2013.01); *H01L 21/823481* (2013.01); *H01L 29/0649* (2013.01)
USPC ............................ 438/435; 438/221; 257/506

(58) Field of Classification Search
None
See application file for complete search history.

(56) References Cited

U.S. PATENT DOCUMENTS

| 6,046,487 | A | * | 4/2000 | Benedict et al. | 257/510 |
| 6,165,854 | A | * | 12/2000 | Wu | 438/296 |
| 6,255,176 | B1 | * | 7/2001 | Kim et al. | 438/296 |
| 6,426,272 | B1 | * | 7/2002 | Fu et al. | 438/435 |
| 6,461,937 | B1 | * | 10/2002 | Kim et al. | 438/431 |
| 6,657,276 | B1 | | 12/2003 | Karlsson et al. | |
| 6,984,569 | B2 | | 1/2006 | Karlsson et al. | |
| 2002/0168850 | A1 | * | 11/2002 | Kim | 438/637 |
| 2005/0151218 | A1 | * | 7/2005 | Mouli | 257/446 |
| 2006/0121394 | A1 | | 6/2006 | Chi | |
| 2007/0205489 | A1 | * | 9/2007 | Tilke et al. | 257/618 |
| 2007/0298583 | A1 | * | 12/2007 | Wu et al. | 438/424 |
| 2009/0045468 | A1 | * | 2/2009 | Hook et al. | 257/374 |
| 2009/0184402 | A1 | * | 7/2009 | Chen | 257/647 |

\* cited by examiner

*Primary Examiner* — Andres Munoz
(74) *Attorney, Agent, or Firm* — Scully, Scott, Murphy & Presser, P.C.; Louis J. Percello, Esq.

(57) ABSTRACT

A shallow trench isolation region is provided in which void formation is substantially or totally eliminated therefrom. The shallow trench isolation mitigates active shorts between two active regions of a semiconductor substrate. The shallow trench isolation region includes a bilayer liner which is present on sidewalls and a bottom wall of a trench that is formed in a semiconductor substrate. The bilayer liner of the present disclosure includes, from bottom to top, a shallow trench isolation liner, e.g., a semiconductor oxide and/or nitride, and a high k liner, e.g., a dielectric material having a dielectric constant that is greater than silicon oxide.

10 Claims, 6 Drawing Sheets

METHOD AND STRUCTURE FOR SHALLOW TRENCH ISOLATION TO MITIGATE ACTIVE SHORTS

BACKGROUND

The present disclosure relates to a semiconductor structure and a method of fabricating the same. More particularly, the present disclosure relates to a shallow trench isolation (STI) region which isolates at least one semiconductor device from at least one other semiconductor device and a method of fabricating the same.

Typical semiconductor devices are formed in active regions of a semiconductor substrate. The active regions are defined by isolations regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer.

As indicated, the active regions of each semiconductor device, MOSFET or otherwise, are often separated by isolation regions. One technique for forming isolation regions is local oxidation of silicon (LOCOS). LOCOS typically includes depositing a non-oxidizable mask, such as silicon nitride over a thin layer of oxide grown on a blank silicon wafer. The mask is patterned using photolithography and then the wafer is thermally oxidized. Following oxidation, mesa-like regions of silicon are formed that are surrounded by silicon oxide insulation. The active devices are then formed using the silicon mesas.

Another technique for the formation of isolation regions is shallow trench isolation (STI). Formation of STI regions includes forming trenches in a semiconductor material and then filling the trenches with silicon oxide or some other type of trench dielectric material. Alternatively, the trenches can be lined with a silicon oxide liner formed by a thermal oxidation process and then filled with additional silicon oxide or another material, such as polysilicon. These "filled" trenches define the size and placement of the active regions. The active regions (or active device regions), in turn, define the areas in which semiconductor devices can be formed.

One trend in modern integrated circuit manufacture is to produce semiconductor devices, (including, for example, MOSFETs, other types of transistors, memory cells, and the like) that are as small as possible. It is also advantageous to reduce the scale of the isolation regions that are formed between the devices. Although the fabrication of smaller devices and isolation regions allows more devices to be placed on a single monolithic substrate for the formation of relatively large circuit systems in a relatively small die area, this downscaling can result in a number of performance degrading effects.

For example, as the width of an STI region is reduced there is a higher propensity to form voids in the STI region due to the high aspect ratio trenches that need to be filled. These voids can act as catastrophic defect sites with a potential to cause shorts between two active regions that ideally should be isolated.

Accordingly, there exists a need in the art for improved isolation between semiconductor devices and for techniques of fabricating the same.

SUMMARY

The present disclosure provides improved shallow trench isolation regions in which void formation is substantially or totally eliminated from the shallow trench isolation region. More particularly, the present disclosure provides improved shallow trench isolation regions in which active shorts between two active regions are mitigated. The improved shallow trench isolation region of the present disclosure includes a bilayer liner which is present on sidewalls and a bottom wall of a trench that is formed in a semiconductor substrate. The bilayer liner of the present disclosure includes, from bottom to top, a shallow trench isolation liner and a high k liner. The shallow trench isolation liner includes a semiconductor oxide and/or semiconductor nitride. By "high k liner" it is meant a dielectric material having a dielectric constant that is greater than silicon oxide. That is, the high k liner of the present disclosure has a dielectric constant of greater than 4.0, with a dielectric constant of greater than 7.0 being more typical.

In one aspect of the present disclosure, a shallow trench isolation region is provided that includes a trench formed in a semiconductor substrate. The trench is defined by sidewalls and a bottom wall. A bilayer liner including, from bottom to top, a shallow trench isolation liner and a high k liner is present in the trench. The shallow trench isolation liner of the bilayer liner is in direct contact with the semiconductor substrate and conforms to the sidewalls and bottom wall of the trench and the high k liner is present on an upper surface of the shallow trench isolation liner. A trench dielectric material such as, for example, silicon oxide, is present on the high k liner and fills a remaining portion of the trench.

In another aspect of the present disclosure, a method of forming a shallow trench isolation region is provided. The method includes forming a trench in a semiconductor substrate. The trench is defined by sidewalls and a bottom wall. A bilayer liner is formed within the trench. The bilayer liner includes, from bottom to top, a shallow trench isolation liner and a high k liner. The shallow trench isolation liner of the bilayer liner is in direct contact with the semiconductor substrate and conforms to the sidewalls and bottom wall of the trench and the high k liner is present on an upper surface of the shallow trench isolation liner. A trench dielectric material such as, for example, silicon oxide, is formed on the high k liner and fills a remaining portion of the trench.

DETAILED DESCRIPTION

The present disclosure, which provides a shallow trench isolation region that mitigates shorts between two active regions and a method of fabricating the same, will now be described in greater detail by referring to the following discussion and drawings that accompany the present disclosure. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present disclosure provides improved shallow trench isolation regions in which void formation is substantially or totally eliminated from the shallow trench isolation region. More particularly, the present disclosure provides improved shallow trench isolation regions in which active shorts between two active device regions are mitigated. The improved shallow trench isolation region of the present disclosure includes a bilayer liner which is present on sidewalls and a bottom wall of a trench that is formed in a semiconductor substrate. The bilayer liner of the present disclosure includes, from bottom to top, a shallow trench isolation liner and a high k liner. By "high k liner" it is meant a dielectric material having a dielectric constant that is greater than silicon oxide. That is, the high k liner of the present disclosure has a dielectric constant of greater than 4.0, with a dielectric constant of greater than 7.0 being more typical. A trench dielectric material is located atop the uppermost layer, i.e., the high k liner, of the bilayer liner and fills a remaining portion of the trench.

Figure 1:
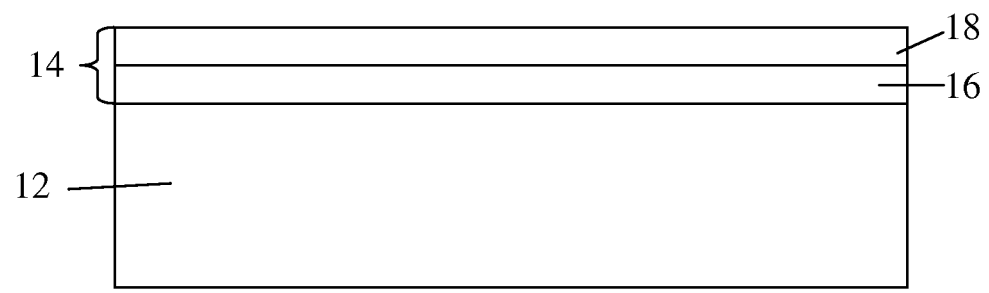
FIG. 1 is a pictorial representation (through a cross sectional view) depicting an initial structure including a pad stack located on an upper surface of a semiconductor substrate that can be employed in one embodiment of the present disclosure.

Reference is now made to FIG. 1-7 which illustrates an embodiment of the present disclosure that can be used in forming the aforementioned improved shallow trench isolation region. Specifically, FIG. 1 illustrates an initial structure 10 that can be employed in one embodiment of the present disclosure. The initial structure includes a pad stack 14 located on an upper surface of a semiconductor substrate 12.

In some embodiments of the present disclosure, the semiconductor substrate 12 is a bulk semiconductor substrate. When a bulk semiconductor substrate is employed as semiconductor substrate 12, the bulk semiconductor substrate is comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the bulk semiconductor substrate is comprised of Si.

In another embodiment, a semiconductor-on-insulator (SOI) substrate (not specifically shown) is employed as the semiconductor substrate 12. When employed, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of Si. In another embodiment, hybrid SOI substrates are employed which have different surface regions of different crystallographic orientations.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

The semiconductor substrate 12 may be doped, undoped or contain doped and undoped regions therein. For clarity, the doped regions are not specifically shown in the drawings of the present application. Each doped region within the semiconductor substrate 12 may have the same, or they may have different conductivities and/or doping concentrations. The doped regions that are present in the semiconductor substrate 12 are typically referred to as well regions and they are formed utilizing a conventional ion implantation process or gas phase doping.

As mentioned above, the initial structure 10 shown in FIG. 1 also includes a pad stack 14 atop the semiconductor substrate 12. The pad stack 14 includes a semiconductor oxide layer 16 that is located on an upper surface of semiconductor substrate 12 and a semiconductor nitride layer 18 that is located on an upper surface of the semiconductor oxide layer 16. In one embodiment, the semiconductor oxide layer 16 comprises silicon oxide, while the semiconductor nitride layer 18 comprises silicon nitride.

The pad stack 14 can be formed utilizing conventional deposition processes that are well known to those skilled in the art. For example, the pad stack 14 can be formed utilizing chemical vapor deposition (CVD), plasma enhanced chemical vapor deposition (PECVD), atomic layer deposition (ALD), evaporation, and physical vapor deposition. Alternatively, pad stack 14 can be formed utilizing a thermal growth process including, for example, oxidation and nitridation. Pad stack 14 can also be formed utilizing any combination of the above mentioned techniques. For example and for the embodiment illustrated in FIG. 1, pad stack 14 can be formed by either depositing or thermally growing the semiconductor oxide layer 16 and then depositing or thermally growing the semiconductor nitride layer 18.

The thickness of the pad stack 14 that is formed varies depending on the technique(s) used in forming the pad stack 14. Typically, pad stack 14 has a thickness from 10 nm to 100 nm, with a thickness from 40 nm to 80 nm being more typically. For the embodiment illustrated in FIG. 1, the thickness of the semiconductor oxide layer 16 is typically from 3 nm to 10 nm, more typically from 4 nm to 6 nm, and thickness of the semiconductor nitride layer 18 is typically from 7 nm to 90 nm, more typically from 35 nm to 70 nm.

Figure 2:
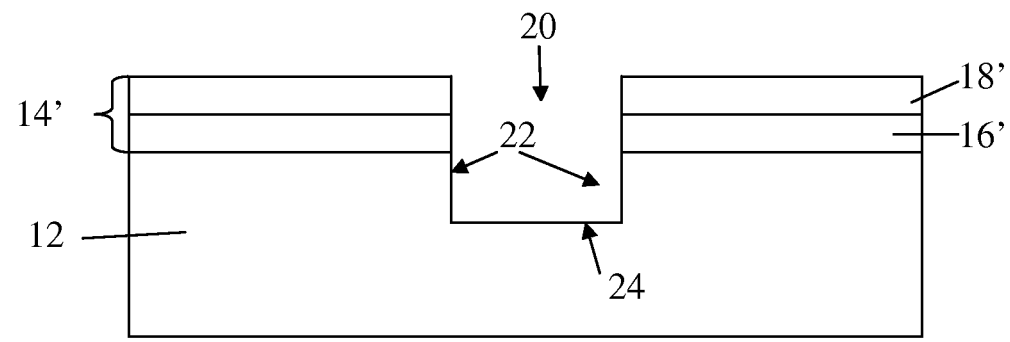
FIG. 2 is a pictorial representation (through a cross sectional view) depicting the structure of FIG. 1 after patterning the pad stack and forming a trench in the semiconductor substrate.

Reference is now made to FIG. 2 which depicts the structure of FIG. 1 after patterning the pad stack 14 and forming a trench 20 in the semiconductor substrate 12. It is noted that although a single trench is depicted and described herein, the present disclosure can be used to form a plurality of trenches in the semiconductor substrate 12. In FIG. 2, reference numerals 14', 16' and 18' denote the patterned pad stack, patterned semiconductor oxide layer, and the patterned semiconductor nitride layer, respectively.

The trench 20 is formed by first providing a patterned photoresist (not shown) having a trench pattern therein atop pad stack 14. The patterned photoresist is formed by applying a photoresist to the surface of the pad stack 14 utilizing a conventional deposition process such as, for example, spin on coating and evaporation. The photoresist is then patterned by conventional lithography which includes exposing the photoresist to a pattern of radiation and then developing the exposed resist utilizing a conventional resist developer. After providing the patterned photoresist, the trench pattern is transferred to the underlying pad stack 14 and then to semiconductor substrate 12. In one embodiment, the patterned photoresist is removed after transferring the trench pattern into pad stack 14 utilizing a conventional resist stripping process such as, for example, ashing. In another embodiment, the patterned photoresist is removed after transferring the trench pattern into both the pad stack 14 and the semiconductor substrate 12 utilizing a conventional resist stripping process such as, for example, ashing. The transfer of the trench pattern from the patterned photoresist into the pad stack 14 and then the semiconductor substrate 12 is achieved utilizing one or more etching processes including, for example, dry etching and/or chemical wet etching etching. When a dry etching process is employed, one of reactive ion etching (RIE), plasma etching, ion beam etching and laser ablation can be used. When a chemical wet etching process is employed, a chemical etchant that selectively removes one material layer relative to another can be used.

The trench 20 that is formed in the semiconductor substrate 12 includes sidewalls 22 which are connected with a common bottom wall 24. The sidewalls 22 of the trench 20 may be substantially vertical, or they may have some taper associated therewith. The depth of trench 20, as measured from an upper surface of the semiconductor substrate 12 to the bottom wall 24 of the trench 20, may vary depending on the etching process employed in forming the same. Typically, the depth of trench 20 is from 25 nm to 300 nm, with a depth from 50 nm to 250 nm being more typical. The aspect ratio (i.e., length to width ratio) of the trench may vary. In some embodiments, the trench 20 has an aspect ratio of greater than 3:1. In yet other embodiments, the trench 20 has an aspect ratio of greater than 5:1.

In embodiments in which a SOI substrate is employed as semiconductor substrate 12, the bottom wall of the trench can stop within the semiconductor layer, be located at the interface between the semiconductor layer and the underlying buried insulating layer, or extend at least into a portion of the underlying buried insulating layer. When a plurality of trenches is formed, each trench can have the same depth and/or same aspect ratio, or multiple depth and/or aspect ratio trenches can be formed.

After forming the trench 20 within the semiconductor substrate 12 and removal of the patterned photoresist, the sidewalls 22 and the bottom wall 24 of the trench 20 are typically subjected to a cleaning process, which removes any surface oxides and other surface contaminates from the sidewalls and bottom wall of the trench.

Figure 3:
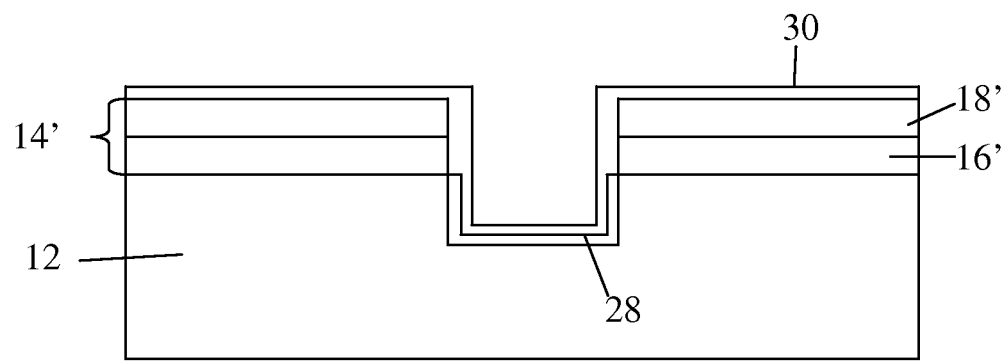
FIG. 3 is a pictorial representation (through a cross sectional view) depicting the structure of FIG. 2 after forming a bilayer liner within the trench.

Reference is now made to FIG. 3, which depicts the structure of FIG. 2 after forming a bilayer liner within the trench 20. The bilayer liner comprises, from bottom to top, a shallow trench isolation liner 28 and a high k liner 30. As shown, the shallow trench isolation liner 28 is in direct contact with exposed surfaces of the semiconductor substrate 12 and the shallow trench isolation liner 28 conforms to the sidewalls 22 and bottom wall 24 of the trench 20.

The shallow trench isolation liner 28 of the bilayer liner includes a semiconductor oxide, a semiconductor nitride or a multilayered stack thereof. In one embodiment, the shallow trench isolation liner 28 is a semiconductor oxide such as, for example, silicon oxide. In another embodiment, the shallow trench isolation liner 28 is a semiconductor nitride such as, for example, silicon nitride. As is illustrated, the shallow trench isolation liner 28 is only present within the trench formed in the semiconductor substrate 12; no portion of the shallow trench isolation liner 28 is present on both the sidewalls and the upper surface of the patterned pad stack 14'.

The shallow trench isolation liner 28 can be formed utilizing a thermal growing technique. Illustrated examples of thermal growing techniques that can be used in forming the shallow trench isolation liner 28 include oxidation and nitridation.

The thickness of the shallow trench isolation liner 28 may vary depending on the material of the shallow trench isolation liner 28 and the technique that is employed in forming the same. Typically, the shallow trench isolation liner 28 has a thickness from 1 nm to 10 nm, with a thickness from 3 nm to 5 nm being more typical.

As stated above, the bilayer liner also includes a high k liner 30. The high k 30 liner is not in direct contact with the semiconductor substrate 12. Rather the shallow trench isolation liner 28 is located between the semiconductor substrate 12 and the high k liner 30. At this junction of the present disclosure, the high k liner 30 is also present on both the sidewalls and the upper surface of the patterned pad stack 14'.

The high k liner 30 that can be employed in the present disclosure includes any dielectric material having a dielectric constant that is greater than silicon oxide. That is, the high k liner 30 of the present disclosure is comprised of a dielectric material that has a dielectric constant of greater than 4.0, with a dielectric constant of greater than 7.0 being more typical. All dielectric constants mentioned herein are relative to a vacuum unless otherwise noted. Specifically, the high k liner 30 that can be employed includes, but is not limited to, an oxide, nitride, oxynitride and/or silicate including metal silicates and nitrided metal silicates. In one embodiment, the high k liner 30 can be comprised of an oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric layer. Each value of x is independently from 0.5 to 3 and each value of y is independently from 0 to 2. In some embodiments, $HfO_2$, hafnium silicate and hafnium silicon oxynitride are employed as the high k liner 30.

The physical thickness of the high k liner 30 may vary, but typically, the high k liner 30 has a thickness from 1 nm to 10 nm, with a thickness from 2 nm to 7 nm being more typical.

The high k liner 30 can be formed by a conformal deposition process such as, for example, chemical vapor deposition (CVD), plasma-assisted CVD, metalorganic chemical vapor deposition (MOCVD), atomic layer deposition (ALD).

Figure 4:
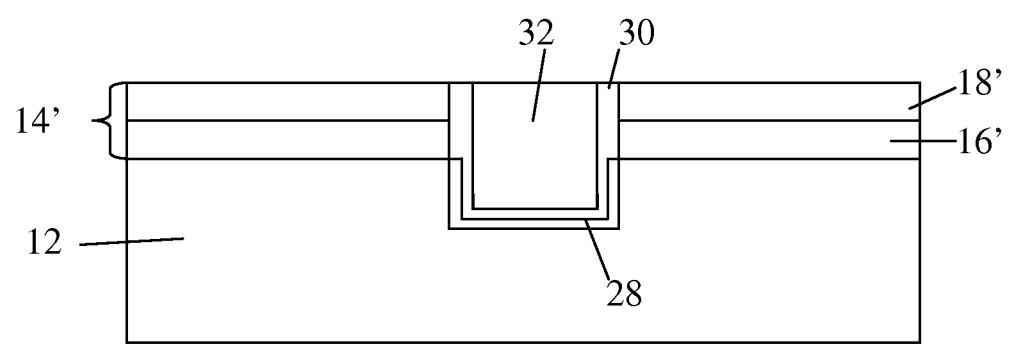
FIG. 4 is a pictorial representation (through a cross sectional view) depicting the structure of FIG. 3 after filling a remaining portion of the trench with a trench dielectric material, optional annealing, planarization and removing surface oxide from atop the patterned pad stack.

Reference is now made to FIG. 4 which depicts the structure of FIG. 3 after filling a remaining portion of the trench 20 with a trench dielectric material 32, optional annealing, planarization and removing surface oxide from atop the patterned semiconductor nitride layer 18'. The filling of the remaining portion of the trench 20 with the trench dielectric material 32 includes selecting a trench dielectric material such as, for example, silicon oxide, silicon nitride, high density plasma tetraethylorthosilicate (TEOS), or polysilicon, and depositing the trench dielectric material 32. The depositing of the trench dielectric material includes any conventional deposition process such as, for example, CVD, including low pressure CVD, and PECVD.

The optional anneal which follows the trench dielectric fill serves to increase the density of the original trench dielectric material. The optional anneal, which includes a rapid thermal anneal, a furnace anneal, a microwave anneal or a laser anneal, can be performed at a temperature from 800° C. to 1200° C., with a temperature from 900° C. to 1150° C. being more typical. The optional 'densification' anneal can be performed in an inert ambient such as, for example, He, Ne, Kr, Xe, and nitrogen which may or may not include oxygen. Alternatively, the optional 'densification' anneal can be performed in an oxygen-containing ambient such as steam. The anneal can be performed utilizing a single anneal or multiple anneals can be employed. It is observed that the anneal can be performed utilizing a single ramp up step or it can be performed utilizing various ramp and soak cycles. The duration of the optional 'densification' anneal may vary depending on the type of anneal process used, the temperature of the anneal, and the type of trench dielectric material 32 employed. In one embodiment, the anneal can be performed for a time period from 30 minutes to 60 minutes.

The planarization which follows the optional anneal removes any excess trench dielectric material 32 and high k liner 30 which may extend above and upon an uppermost surface of the patterned pad stack 14'. The planarization that can be employed includes chemical mechanical polishing (CMP) and/or grinding. The planarization process which stops on the uppermost surface of the patterned pad stack 14' ensures that the upper surface of the remaining trench dielectric material 32 is substantially coplanar with the uppermost surface of the patterned pad stack 14'. In the illustrated embodiment, the planarized trench dielectric material is substantially coplanar with the upper surface of the patterned semiconductor nitride 18'.

In the illustrated embodiment, the removal of the surface oxide atop the patterned semiconductor nitride 18' that follows the planarization process includes any chemical etchant that selectively removes surface oxides from the patterned semiconductor nitride 18'. In one embodiment, a diluted or buffered HF solution can be used to remove the surface oxides from the patterned semiconductor nitride 18'.

Figure 5:
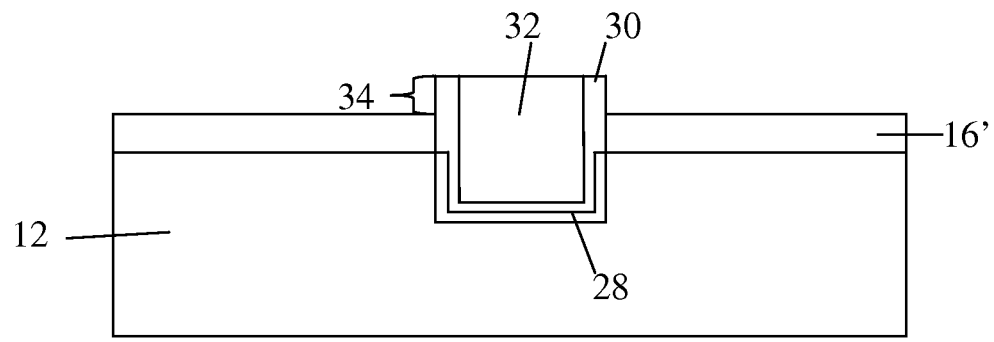
FIG. 5 is a pictorial representation (through a cross sectional view) depicting the structure of FIG. 4 after removing an upper material layer of the patterned pad stack.

Reference is now made to FIG. 5 which depicts the structure of FIG. 4 after removing an upper material layer, e.g., the patterned semiconductor nitride 18', of the patterned pad stack 14'. The removal of the patterned semiconductor nitride 18' can be performed utilizing any chemical stripping process that selectively removes nitride relative to oxide and the trench dielectric material 32. In one embodiment, hot phosphoric acid can be used to remove the patterned semiconductor nitride 18' from the structure. As illustrated in FIG. 5, a portion of the shallow trench isolation region (labeled as 34 in FIG. 5) protrudes above the upper surface of the remaining patterned pad stack 14' material layer, i.e., the patterned semiconductor oxide 16'.

Figure 6:
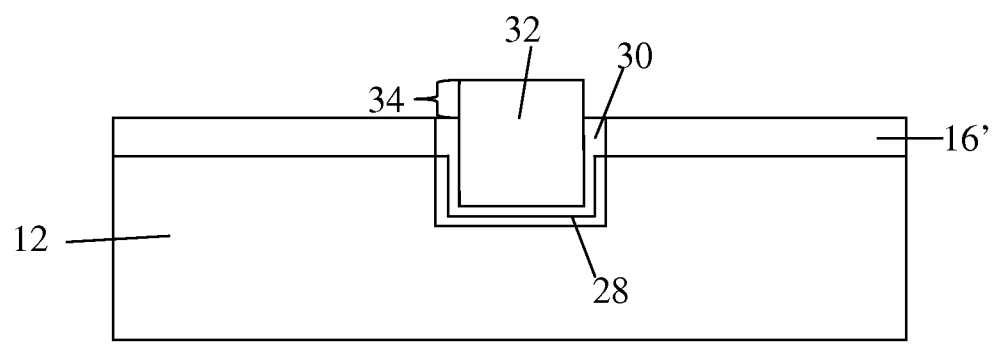
FIG. 6 is a pictorial representation (through a cross sectional view) depicting the structure of FIG. 5 after performing a selective etching step that removes exposed sidewalls of the bilayer liner.

Reference is now made to FIG. 6 which depicts the structure of FIG. 5 after performing a selective and isotropic etching step that removes exposed sidewalls of the bilayer liner, e.g., the high k liner 30, from the protruding portion 34 of the shallow trench isolation region. The selective and isotropic etch that can be performed removes the exposed portions of the high k liner 30 selective to the trench dielectric material 32. As is illustrated the protruding portion 34 of the shallow trench isolation region now only includes trench dielectric material 32. In one embodiment, a hot chuck reactive ion etching process can be used.

Figure 7:
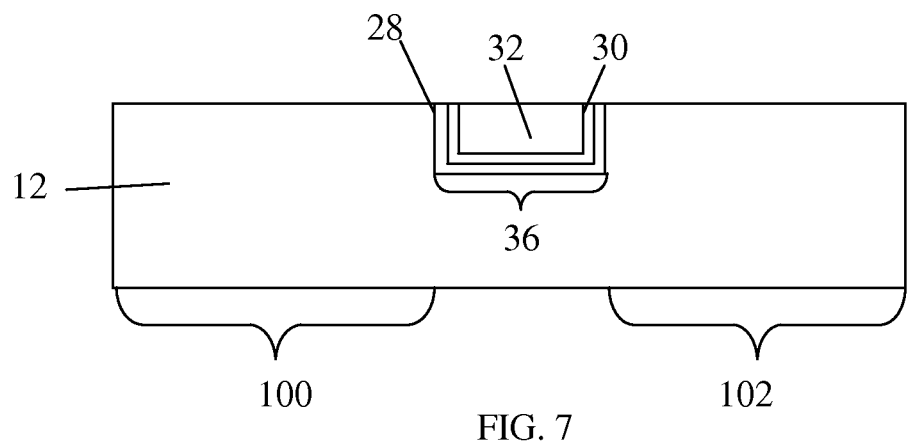
FIG. 7 is a pictorial representation (through a cross sectional view) depicting the structure of FIG. 6 after removing any remaining portion of the patterned pad stack, bilayer liner and trench dielectric material that is present above the upper surface of the semiconductor substrate.

Reference is now made to FIG. 7 which depicts the structure of FIG. 6 after removing the remaining portion of the patterned pad stack 14', i.e., the patterned semiconductor oxide 16', as well as portions of the high k liner 30 and the trench dielectric material 32 that are present above the upper surface of the semiconductor substrate 12. The removal of the patterned semiconductor oxide 16' and the trench dielectric material 32 that is presence above the upper surface of the semiconductor substrate 12 can be performed utilizing a planarization process such as, for example, chemical mechanical planarization (CMP) and/or grinding. The structure shown in FIG. 7 contains a shallow trench isolation region 36 that defines and separates a first active region 100 and a second active region 102. The shallow trench isolation region 36 includes the bilayer liner and the trench dielectric material 32. The bilayer liner comprises, from bottom to top, the shallow trench isolation liner 28 and the high k liner 30 within the trench 20. As mentioned above, the bilayer liner substantially or completely eliminates void formation with the STI region and thus mitigates shorts from occurring between two the neighboring active regions.

Figure 8:
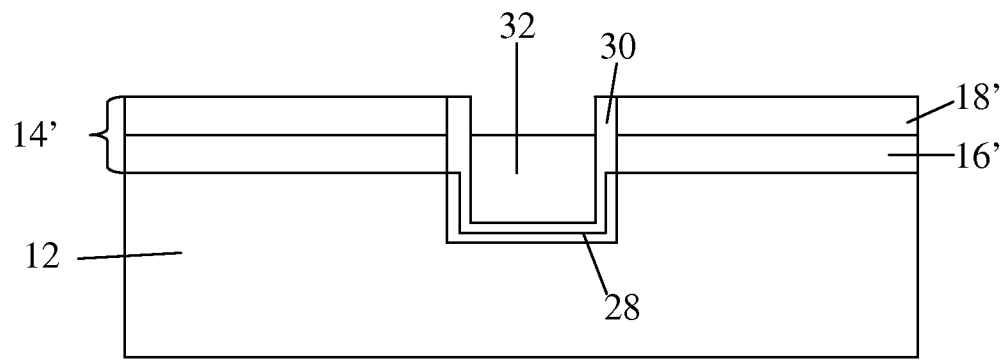
FIG. 8 is a pictorial representation (through a cross sectional view) of the structure shown in FIG. 3 after filling a remaining portion of the trench with a trench dielectric material, optional annealing, planarization and adjusting the height of the trench dielectric material, in accordance with another embodiment of the present disclosure.
Figure 9:
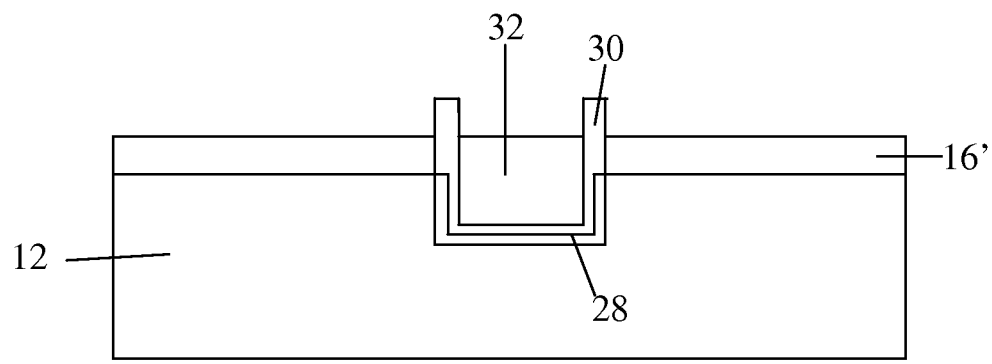
FIG. 9 is a pictorial representation (through a cross sectional view) of the structure shown in FIG. 8 after selectively removing a top portion of the patterned pad stack relative to a bottom portion of the patterned pad stack.
Figure 10:
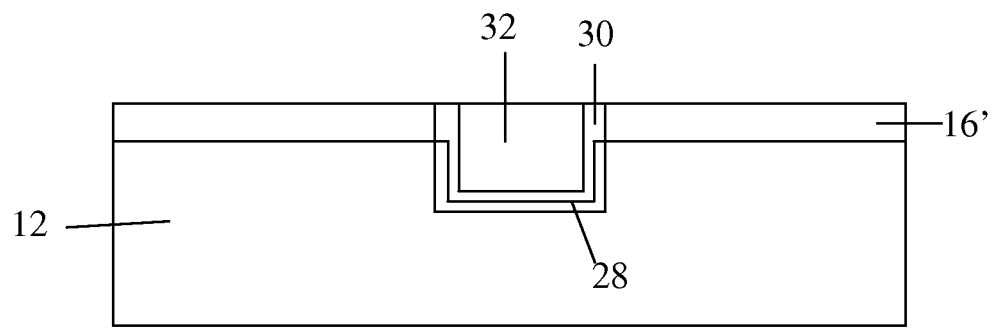
FIG. 10 is a pictorial representation (through a cross sectional view) of the structure shown in FIG. 9 after performing an etching step that removes exposed sidewalls of the bilayer liner.

It is observed that FIGS. 1-7 represent one embodiment of the present disclosure. Reference is now made to FIGS. 8-10 which illustrates another embodiment of the present disclosure. The embodiment illustrated in FIGS. 8-10 begins with first providing the structure shown FIG. 3. After providing the structure shown in FIG. 3, that structure is subjected to steps including filling a remaining portion of the trench 20 with a trench dielectric material 32, optional annealing, planarization and adjusting the height of the trench dielectric material 32. The filling of the remaining portion of trench 20, optional annealing and planarization are the same as those described above in regard to the structure shown in FIG. 4.

The adjusting of the height of the trench dielectric material 32 includes thinning the trench dielectric material 32 to a height that is substantially coplanar with an upper surface of the patterned semiconductor oxide 16'. The adjusting step includes any etching process (wet or dry) that can selectively remove a portion of the trench dielectric material 32 relative to the materials of the bilayer liner and the patterned semiconductor oxide. In one embodiment of the present disclosure, a dilute HF solution can be used to adjust the height of the trench dielectric material 32.

Reference is now made to FIG. 9 which depicts the structure of FIG. 8 after selectively removing a top portion, e.g., the patterned semiconductor nitride 18', of the patterned pad stack 14' relative to a bottom portion, e.g., the patterned semiconductor oxide 16', of the patterned pad stack 14'. The step of the present disclosure can be achieved by utilizing a chemical mechanical polishing (CMP) process that is removes nitride selective to oxide. After the CMP process, hot phosphoric acid or another like etchant can be used to remove any residual nitride material from atop the patterned semiconductor oxide 16'.

FIG. 10 is a pictorial representation (through a cross sectional view) of the structure shown in FIG. 9 after performing an etching step that removes exposed portions of the high k liner 30 of the bilayer liner that extends above the upper surface of the patterned semiconductor oxide 16'. This step of the illustrated embodiment includes the selective and isotropic etching step mentioned above in regard to FIG. 6. After providing the structure shown in FIG. 10, a planarization process is performed to remove the patterned semiconductor oxide 16' from atop the semiconductor substrate 12 as well as portions of the high k liner 30 and trench dielectric material 32 that extend above the upper surface of the semiconductor substrate 12 providing the structure shown, for example, in FIG. 7. The planarization process includes one of the techniques mentioned above in regard to providing the structure shown in FIG. 7.

Figure 11:
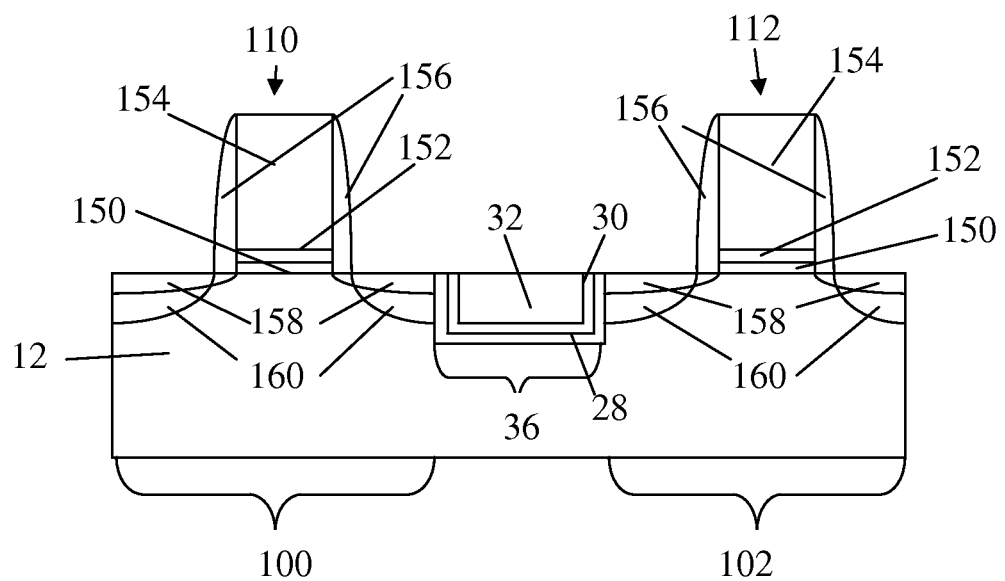
FIG. 11 is a pictorial representation (through a cross sectional view) depicting the structure of FIG. 7 after forming a first semiconductor device in a first active region of the substrate and forming a second semiconductor device in a second active region of the substrate, wherein the first and second semiconductor devices are isolated by a shallow trench isolation region including the bilayer liner.

Reference is now made to FIG. 11 which depicts the structure of FIG. 7 after forming a first semiconductor device 110 in the first active region 100 of the semiconductor substrate 12 and forming a second semiconductor device 112 in the second active region 102 of the semiconductor substrate 12. In one embodiment, the first and second devices are field effect transistors (FETs) of different polarities, i.e., a pFET and an nFET. Each FET may include an optional chemox layer 150, a gate dielectric layer 152, a gate conductor 154, an optional sidewall spacer 156, source/drain extensions 158 and a source/drain regions 160. The FETs can be formed utilizing any conventional processing flow including the steps of deposition, lithography and etching. Alternatively, a replacement gate process can be employed in forming each FET.

If present, the optional chemox layer 150 can be formed on, or within, the semiconductor substrate 12 in each device region prior to forming the gate dielectric layer 152. The optional chemox layer 150 is formed utilizing a conventional growing technique that is well known to those skilled in the art including, for example, oxidation or oxynitridation. In some embodiments, the optional chemox layer 150 is formed by a wet chemical oxidation process. When the semiconductor substrate 12 is a Si-containing semiconductor, the optional chemox layer 150 is comprised of silicon oxide, silicon oxynitride or a nitrided silicon oxide. When the semiconductor substrate 12 is other than a Si-containing semiconductor, the optional chemox layer 150 may comprise a semiconducting oxide, a semiconducting oxynitride or a nitrided semiconducting oxide. The thickness of the optional chemox layer 150 is typically from 0.5 nm to 1.5 nm, with a thickness from 0.8 nm to 1 nm being more typical. The thickness, however, may be different after processing at higher temperatures, which are usually required during FET or CMOS fabrication.

The gate dielectric layer 152 is comprised of any insulating material such as silicon oxide, silicon nitride or silicon oxynitride. In one embodiment, the gate dielectric layer 152 is a high k gate dielectric that has a dielectric constant of greater than silicon oxide, i.e., 4.0 or greater. All dielectric constants mentioned herein are relative to a vacuum unless otherwise noted. Specifically, the high k gate dielectric layer that can be employed includes, but is not limited to, an oxide, nitride, oxynitride and/or silicate including metal silicates and nitrided metal silicates. In one embodiment, the high k gate dielectric layer can be comprised of an oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric layer. Each value of x is independently from 0.5 to 3 and each value of y is independently from 0 to 2. In some embodiments, $HfO_2$, hafnium silicate and hafnium silicon oxynitride are employed as the high k gate dielectric layer.

The physical thickness of the gate dielectric layer 152 may vary, but typically, the gate dielectric layer 152 has a thickness from 0.5 nm to 10 nm, with a thickness from 0.5 nm to about 3 nm being more typical. The gate dielectric layer 152 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric layer 152 may also be formed utilizing any combination of the above processes. In some embodiments, the gate dielectric material within each of the various device regions is different. Different gate dielectric materials can be formed by utilizing block mask technology.

As mentioned above, each FET also includes a gate conductor (or gate electrode) 154. The gate conductor 154 that is employed may comprise any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate conductor 154 is comprised of TiN. In some instances, a single layer of gate conductor 154 is formed. In another instances, a first layer of conductive material and a second layer of conductive material are formed. In one embodiment, gate conductor 154 may include a stack, from bottom to top, of a conductive metal layer and an upper conductive Si-containing material layer; the conductive metal layer has a higher conductivity than the conductive Si-containing material layer.

The gate conductor 154 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate conductor 154, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed. The as deposited gate conductor 154 typically has a thickness from 5 nm to 200 nm, with a thickness from 20 nm to 100 nm being more typical. In some embodiments, the gate conductor 154 in the first device region is different from the gate conductor 154 in the second device region. When such FETs are formed, block mask technology can be used to form the different gate conductor materials within the different device regions.

In some embodiments, an optional hard mask material (not shown) can be formed atop the gate conductor 154. The optional hard mask material includes an oxide, a nitride, an oxynitride or any combination thereof including multilayered stacks. When present, the optional hard mask material is formed utilizing a conventional deposition process well known to those skilled in the art including, for example, CVD and PECVD. Alternatively, the optional hard mask material is formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being more typical. The hard mask material is typically employed when the conductive material is a Si-containing material such as polysilicon or SiGe.

The source/drain extension regions 158 are formed utilizing any known extension ion implantation process. After the extension ion implantation, an anneal can be used to activate the implanted extension ions. The optional sidewall spacer 156 can be formed utilizing any known process including deposition of a spacer material, followed by etching. Typical spacer materials include an oxide and/or a nitride. After formation of the spacer, source/drain regions 160 are formed into an upper exposed surface of the substrate at the footprint of each of the patterned gate stacks. The source/drain regions 160 are formed utilizing a source/drain ion implantation process followed by annealing. The metal semiconductor alloy contacts are formed utilizing any process that is capable of forming a metal semiconductor alloy atop a semiconductor material. In one embodiment, the metal semiconductor alloy contacts can be formed utilizing a silicide process. The silicide process can be self-aligned to the outer edge of the spacer. The silicide process includes forming a metal capable of forming a metal semiconductor alloy when reacted with a semiconductor material. The metal used in forming the metal semiconductor alloy contact can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the patterned conductive material, when no optional patterned hard mask is present and the conductive material is composed of a Si-containing material.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a shallow trench isolation region, said method comprising:
    forming a pad stack on an uppermost surface of a semiconductor substrate, wherein said pad stack includes, from bottom to top, a semiconductor oxide and a semiconductor nitride;
    forming a trench into both said pad stack and said semiconductor substrate, said trench is defined by sidewalls and a bottom wall;
    forming a shallow trench isolation liner directly on said sidewalls and said bottom wall of said trench, but not on any portion of the pad stack;
    forming a high-k liner selected from at least one of a dielectric metal oxide, a dielectric metal nitride, a dielectric metal oxynitride, a dielectric metal silicate, and a dielectric nitrided metal silicate directly on exposed surfaces of said shallow trench isolation liner, and on exposed sidewall surfaces of said pad stack and a topmost surface of said pad stack;

forming a trench dielectric material in direct physical contact with exposed surfaces of the high-k liner, completely filling said trench, and having an uppermost surface that is coplanar with said topmost surface of said pad stack;

removing remaining portions of said semiconductor nitride to expose a topmost surface of remaining portions of said semiconductor oxide and to provide a protruding portion of the shallow trench isolation region which extends above said topmost surface of said remaining portions of said semiconductor oxide;

removing exposed portions of the high-k liner from said protruding portion of the shallow trench isolation region; and removing a remaining protruding portion of said shallow trench isolation region and said remaining portions of said semiconductor oxide.

2. The method of claim 1 wherein said forming the trench comprises lithography and etching.

3. The method of claim 1 wherein said high-k liner is selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof or a multilayered stack thereof, wherein x is independently from 0.5 to 3 and y is independently from 0 to 2.

4. The method of claim 1 wherein said high-k liner is $HfO_2$, hafnium silicate or hafnium silicon oxynitride.

5. The method of claim 1 further comprising forming a first semiconductor device on a first active region of said semiconductor substrate and forming a second semiconductor device on a second active region of said semiconductor substrate, wherein said shallow trench isolation region separates the first active region from said second active region.

6. A method of forming a shallow trench isolation region, said method comprising:

forming a pad stack on an uppermost surface of a semiconductor substrate, wherein said pad stack includes, from bottom to top, a semiconductor oxide and a semiconductor nitride;

forming a trench into both said pad stack and said semiconductor substrate, said trench is defined by sidewalls and a bottom wall;

forming a shallow trench isolation liner directly on said sidewalls and said bottom wall of said trench, but not on any portion of the pad stack;

forming a high-k liner selected from at least one of a dielectric metal oxide, a dielectric metal nitride, a dielectric metal oxynitride, a dielectric metal silicate, and a dielectric nitrided metal silicate directly on exposed surfaces of said shallow trench isolation liner; and forming a trench dielectric material in direct physical contact with exposed surfaces of the high-k liner, completely filling said trench, wherein no surface of the trench dielectric material directly contacts any portion of the semiconductor substrate, and wherein said forming the trench dielectric material includes depositing the trench dielectric material, annealing the trench dielectric material, planarizing and adjusting a height of the trench dielectric material such that the height of the trench dielectric material after said adjusting is coplanar with an upper surface of remaining portions of said semiconductor oxide, and removing said remaining portions of said semiconductor oxide and a portion of said high-k liner and a portion of said trench dielectric material.

7. The method of claim 6 wherein said forming the trench comprises lithography and etching.

8. The method of claim 6 wherein said high-k liner is selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof or a multilayered stack thereof, wherein x is independently from 0.5 to 3 and y is independently from 0 to 2.

9. The method of claim 6 wherein said high-k liner is $HfO_2$, hafnium silicate or hafnium silicon oxynitride.

10. The method of claim 6 further comprising forming a first semiconductor device on a first active region of said semiconductor substrate and forming a second semiconductor device on a second active region of said semiconductor substrate, wherein said shallow trench isolation region separates the first active region from said second active region.

* * * * *